United States Patent [19]

Chen et al.

[11] Patent Number: 4,897,615
[45] Date of Patent: Jan. 30, 1990

[54] HIGH EFFICIENCY AMPLIFIER

[75] Inventors: Tzu-Hung Chen, East Brunswick; Mahesh Kumar, Lawrenceville, both of N.J.

[73] Assignee: Siemens Aktiengesellschaft, Berlin and Munich, Fed. Rep. of Germany

[21] Appl. No.: 278,094

[22] Filed: Nov. 30, 1988

[51] Int. Cl.$^4$ .............................................. H03F 3/30
[52] U.S. Cl. .................................................. 330/263
[58] Field of Search ................. 330/55, 263, 264, 276, 330/286, 295, 122

[56] References Cited

U.S. PATENT DOCUMENTS

| | | | |
|---|---|---|---|
| 3,495,183 | 2/1970 | Doundoulakis et al. | 330/295 X |
| 3,699,465 | 10/1972 | Pranke | 330/112 X |
| 3,784,932 | 1/1974 | Wisherd | 330/295 X |

OTHER PUBLICATIONS

Donahue et al., "Part II: Putting the Overlay to Work at High Frequencies", *Electronics*, Aug. 23, 1965, pp. 78–81.

"Pulsed Power Transistor: 1 np at 1 GHz", *Microwave Journal*, vol. 22, No. 6, Jun. 1979, p. 34.

B. S. Yarman et al., IEEE Transactions on Microwave Theory and Techniques, pp. 2216–2222, Dec. 1982.

D. A. Sunderland et al., IEEE Transaction on Electron Devices, pp. 367–377, Feb. 1987.

*Primary Examiner*—James B. Mullins
*Attorney, Agent, or Firm*—John Francis Moran

[57] ABSTRACT

Amplifiers operating in push-pull are implemented to obviate input baluns and output signal combiners and their attendant losses. Amplifiers having two signal branches that each receive the input signal and have their signal branch outputs connected directly together. Each branch operates during alternate half cycles of the input signal while direct combining of the branch signal outputs produces a composite signal corresponding to the complete input signal. Each branch includes a matching input circuit and a heterojunction bipolar transistor whcih may be configured in either common collector or common emitter arrangement. The transistors are different since one is an NPN while the other is a PNP but they are selected to have similar direct current and radio frequency characteristics.

9 Claims, 2 Drawing Sheets

HIGH EFFICIENCY AMPLIFIER

BACKGROUND OF THE INVENTION

The present invention relates to high efficiency amplifiers, and it relates, more particularly, to push-pull amplifiers employing different transistors having similar characteristics in terms of biasing and signal operation.

Conventional push-pull amplifiers include two identical signal branches that operate in 180° phase relationship or in phase opposition wherein input and output connections are each balanced to ground. The phase relationship produces additive output components of the desired wave. A disadvantage is that the passive circuit elements required to establish the phase relationship between the two branches occasion losses particularly in the output portion of the amplifier. These losses are present no matter what class of operation, for example, class A mode or class B mode, is used for the active amplifying devices.

In high frequency amplifiers, GaAs FETs are generally employed in the push-pull configuration which operates in a class B mode. Typically, a 180° balun is used on the input side of the amplifier while a 180° combiner is used on the output side of the amplifier. Both of these components introduce additional losses and restrict the bandwidth of operation by narrowing it. The overall efficiency of push-pull amplifiers currently available is similar to a class A amplifier due to the additional losses in the balun and combiner.

SUMMARY OF THE INVENTION

It is a primary object of the present invention to provide a push-pull amplifier of higher efficiency than conventional amplifiers.

A related object of the invention is to obviate the requirement of conventional passive circuit elements such as baluns and 180° signal combiners in push-pull amplifier.

An illustrative embodiment of the invention is in the form of an amplifier including two signal branches connected to receive the input signal and each producing a branch output signal corresponding to an amplified portion of the input signal. The output branch signals are directly combined to form a composite signal which is an amplified version of the complete input signal. The portions of the input signal correspond to alternate half cycles of the input signal.

In some of the aspects of the invention, each signal branch includes a heterojunction bipolar transistor (HBT) having a base, emitter and collector. One branch includes an NPN structured HBT while the other branch includes a PNP structured HBT. The two HBTs are selected to have similar direct current and radio frequency characteristics. In one arrangement in accordance with the invention, the HBTs are in a common collector configuration. In another arrangement according to the invention, the HBTs are in a common emitter configuration. In each case, the output terminal of the HBTs are connected directly together. The respective inputs to each HBT include an individual matching network while a single output matching network is used for both HBTs.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
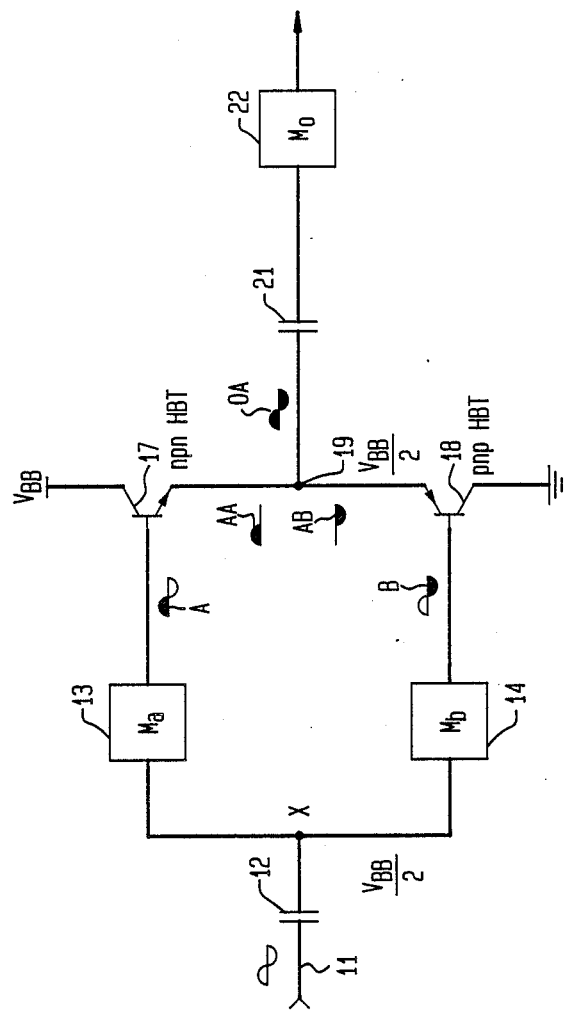
FIG. 1 is a schematic diagram of an amplifier in accordance with the invention wherein two matched HBT are configured in a common collector push-pull arrangement.

In FIG. 1, an input signal at terminal 11 is applied via input capacitor 12 to two matching circuits 13 and 14 also designated Ma and Mb to produce respective output signals A and B. Signal A is applied to the base of an NPN heterojunction bipolar transistor (HBT) 17. Signal B is applied to the base of a PNP HBT 18 through matching circuit 14. The output signals of HBTs 17 and 18 designated AA and AB are combined at node 19 depicted as resulting output signal OA. Output signal OA is coupled via capacitor 21 to an output matching circuit 22 also designated Mo. Output signal OA is impedance matched to a desired value, typically fifty ohms, by matching circuit 22.

In operation, the input signal during positive half cycles produces an amplified current flow in the emitter of HBT 17 while HBT 18 is turned off and presents a high impedance at circuit node 19. Similarly, the input signal during negative half cycles produces an amplified current flow in the emitter of HBT 18. After amplification by HBTs 17 and 18, the two output signals are combined at node 19.

The characteristics of transistors 17 and 18 enable the foregoing operation in class B mode to achieve high efficiency. The combined operation of the two signal branches produces a resulting signal operating in class A mode and is therefore linear. Due to elimination of band limited signal combiners and dividers, the circuit is readily able to amplify over broadband widths.

The various passive and active components in the amplifier of FIG. 1 are known and available to those in the art. For example, the matching circuits, or equalizers, are microwave components which are fully described, for example, in a paper entitled "A Simplified 'Real Frequency' Technique Applied to Broad-Band Multistage Microwave Amplifiers" by B. S. Yarman et al. at page 2216–2222 in IEEE Transactions on Microwave Theory and Techniques, Vol. MTT-30, No. 12, December 1982. In fact, this paper describes a computer aided design (CAD) procedure for treating broad-band matching of an abitrary load to a complex generator. The two NPN and PNP HBTs (transistors 17 and 18) are desired since they are able to have similar direct current and radio frequency characteristics. An advantage of HBTs 17 and 18 over two NPN and PNP transistors is that similar RF performance for the latter is not achievable. Such devices are described in a paper entitled "Optimizing N-p-n and P-n-p Heterojunction Bipolar Transistor for Speed" by D. A. Sunderland et al. in IEEE Transaction on Electron Devices, Vol. ED-34, No. 2, February 1987 at pages 367–377.

The principles involved may be implemented in various circuit configurations. For example, the amplifier of FIG. 1 may be considered as a common collector push-pull arrangement. Also it may be considered as a push-pull emitter follower arrangement. Another arrangement of at least equal importance in practical applications is found in FIG. 2.

Figure 2:
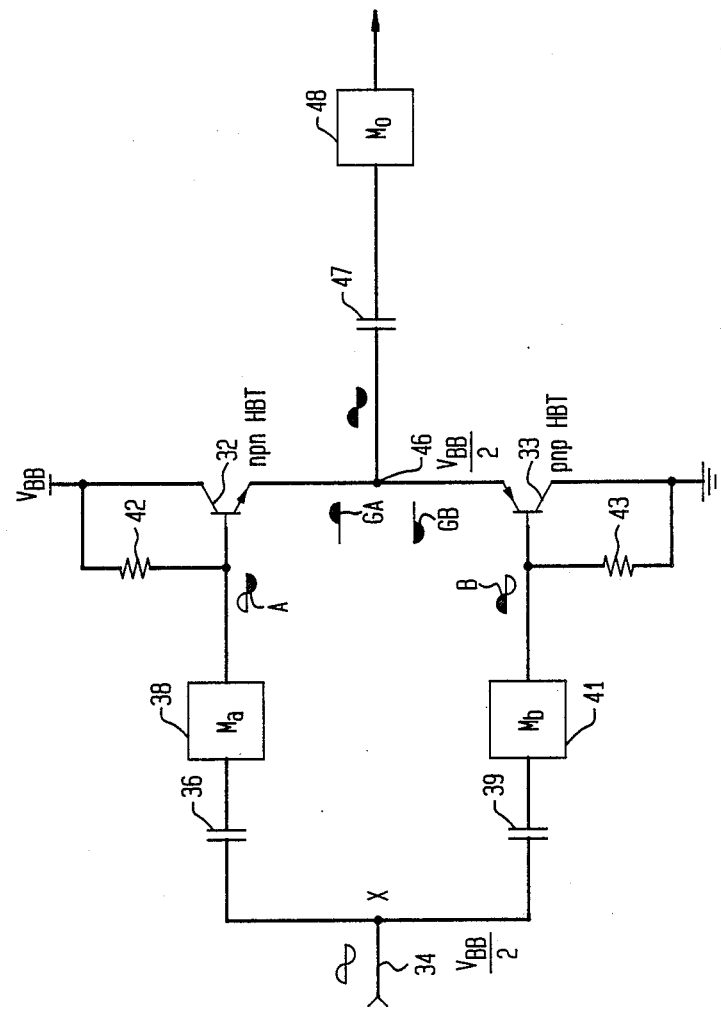
FIG. 2 is an alternative arrangement wherein matched HBTs are in a common emitter push-pull configuration.

FIG. 2 is a schematic diagram of a common emitter push-pull amplifier. In accordance with the two signal branches of a push-pull amplifier, HBTs 32 and 33 receive their respective input signals via their respective input branches. For the base of HBT 32, the signal at input terminal 34 arrives via capacitor 36 and matching circuit 38 (Ma). For the base of HBT 33, the signal at input terminal 34 is coupled thereto by way of capacitor 39 and matching circuit 41. In either amplifier configuration, the matching circuits therein are designed to provide maximum power transfer over the bandwidth contemplated for the amplifier. The bases of HBTs 32 and 33 are biased by respective resistors 42 and 43. As is evident from the signal waveforms in FIG. 2, respective half portions of the input signals are amplified to provide output signals GA and GB which are combined at circuit node 46.

It should be noted that an advantage particularly, present in the circuit of FIG. 2 and also FIG. 1 is the elimination of load resistors which each HBT serves for the other HBT during alternate half cycles. Such an arrangement therefore, also reduces power dissipation while increasing efficiency of operation. As a result, the amplifiers of FIGS. 1 and 2 provide high linearity and high efficiency over a broadband width. While the amplifier of FIG. 1 is particularly suitable for driving low impedance loads, the amplifier of FIG. 2 enables higher impedance loads to be driven. Also, the amplifier of FIG. 1 does not invert while the amplifier of FIG. 2 does invert the signal phase.

There has thus been shown and described a novel amplifier configurations which fulfill all the objects and advantages sought therefor. Many changes, modifications, variations and other uses and applications of the subject invention will, however, become apparent to those skilled in the art after considering this specification and the accompanying drawing which disclose the preferred embodiments thereof. For example, different devices than those presently contemplated for the illustrative amplifier embodiments may be used to advantage. In such a case, it is only necessary that such devices conform in terms of their direct current and radio frequency characteristics. Furthermore, rather than a single device in each signal branch a plurality of devices may be used. All such changes, modifications, variations and other uses and applications which do not depart from the spirit and scope of the invention are deemed to be covered by the invention which is limited only by the claims which follow.

We claim:

1. Apparatus for amplifying broadband input signals, the apparatus comprising:
   a first signal branch for amplifying a first portion of the input signal having first input matching means and first output means for producing a first output branch signal,
   a second signal branch for amplifying a second portion of the input signal having second input matching means for receiving the input signal and second output means for producing a second output branch signal, said first and second input matching means providing the broadband input signals in common phase relationship to each other,
   each signal branch comprising at least one active device connected to its respective one of the first and second input matching means for providing efficient coupling of the input signal to the at least one active device, each signal branch and its at least one active device amplifying a complementary portion of their respective input signals compared to the portion being amplified by the other signal branch; and
   the first and second output means serially connected together in a complementary push-pull configuration to combine respective complementary output branch signals to produce a composite signal and coupled to output matching means for providing efficient coupling of the composite signal to a load.

2. Apparatus for amplifying broadband input signals, the apparatus comprising:
   a first signal branch for amplifying a first portion of the input signal having first input matching means and first output means for producing a first output branch signal,
   a second signal branch for amplifying a second portion of the input signal having second input matching means for receiving the input signal and second output means for producing a second output branch signal,
   each signal branch comprising at least one active device connected to its respective one of the first and second input matching means for providing efficient coupling of the input signal to the at least one active device, each signal branch and its at least one active device amplifying a complementary portion of their respective input signals compared to the portion of the other signal branch;
   the at least one active device for the first signal branch comprising an NPN heterojunction bipolar transistor and the at least one active device for the second signal branch comprising a PNP heterojunction bipolar transistor having similar direct current and radio frequency characteristics to the NPN transistor; and
   the first and second output means serially connected together in a push-pull configuration to combine respective complementary output branch signals to produce a composite signal and coupled to output matching means for providing efficient coupling of the composite signal to a load.

3. Apparatus in accordance with claim 2, wherein the NPN transistor and PNP transistor each have a base, emitter, and collector and the base receives the input signal while the emitter provides the output branch signal.

4. Apparatus in accordance with claim 3, wherein the emitter of the NPN transistor is connected directly to the emitter of the PNP transistor and a fixed powering potential is applied between the collector of the NPN transistor and the collector of the PNP transistor.

5. Apparatus in accordance with claim 4, further comprising a capacitor for receiving the input signal and coupling the input signal to the first input matching means and the second input matching means whose inputs are connected together.

6. Apparatus in accordance with claim 2, wherein the NPN transistor and PNP transistor each have a base, emitter, and collector and the base receives the input signal while the collector provides the output branch signal.

7. Apparatus in accordance with claim 6, wherein the collector of the PNP transistor is connected directly to the collector of the NPN transistor and a fixed powering potential is applied between the emitter of the PNP transistor and the emitter of the NPN transistor.

8. Apparatus in accordance with claim 7, further comprising a resistor for each transistor connected from its emitter to its base for biasing that transistor.

9. Apparatus in accordance with claim 7, further comprising two capacitors having a terminal connected together for receiving the input signal and each capacitor coupling the input signal individually to one of the first and second input matching means.

* * * * *